(12) United States Patent
Furukawa et al.

(10) Patent No.: US 8,450,806 B2
(45) Date of Patent: May 28, 2013

(54) METHOD FOR FABRICATING STRAINED SILICON-ON-INSULATOR STRUCTURES AND STRAINED SILICON-ON INSULATOR STRUCTURES FORMED THEREBY

(75) Inventors: Toshiharu Furukawa, Essex Junction, VT (US); Charles William Koburger, III, Delmar, NY (US); James Albert Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 2136 days.

(21) Appl. No.: 10/814,482

(22) Filed: Mar. 31, 2004

(65) Prior Publication Data

US 2005/0227498 A1 Oct. 13, 2005

(51) Int. Cl.
*H01L 27/12* (2006.01)

(52) U.S. Cl.
USPC .......... 257/368; 438/197; 438/149; 438/239; 257/347; 257/350

(58) Field of Classification Search
None
See application file for complete search history.

(56) References Cited

U.S. PATENT DOCUMENTS

| | | | |
|---|---|---|---|
| 5,332,868 A | 7/1994 | Jain et al. | |
| 6,117,711 A * | 9/2000 | Wu | 438/154 |
| 6,194,256 B1 | 2/2001 | Lee et al. | |
| 6,211,064 B1 | 4/2001 | Lee | |
| 6,261,876 B1 * | 7/2001 | Crowder et al. | 438/149 |
| 6,300,218 B1 | 10/2001 | Cohen et al. | |
| 6,537,862 B2 | 3/2003 | Song | |
| 6,630,699 B1 * | 10/2003 | Wylie | 257/288 |
| 6,657,276 B1 * | 12/2003 | Karlsson et al. | 257/510 |
| 6,717,216 B1 * | 4/2004 | Doris et al. | 257/347 |
| 6,727,147 B2 * | 4/2004 | Nakamura et al. | 438/279 |
| 6,884,667 B1 * | 4/2005 | Doris et al. | 438/164 |
| 6,887,751 B2 * | 5/2005 | Chidambarrao et al. | 438/216 |
| 7,023,051 B2 * | 4/2006 | Forbes | 257/347 |
| 7,067,402 B2 | 6/2006 | Matsumara et al. | |
| 2002/0008289 A1 * | 1/2002 | Murota et al. | 257/369 |
| 2003/0111699 A1 * | 6/2003 | Wasshuber et al. | 257/414 |
| 2004/0150042 A1 * | 8/2004 | Yeo et al. | 257/347 |
| 2004/0150065 A1 * | 8/2004 | Jan et al. | 257/499 |

(Continued)

FOREIGN PATENT DOCUMENTS

| | | |
|---|---|---|
| JP | 01239867 A2 | 9/1989 |
| JP | 05121744 A | 5/1993 |

(Continued)

OTHER PUBLICATIONS

Goodwin, David J., U.S. Patent and Trademark Office, Office Action Dated Apr. 3, 2008 in related U.S. Appl. No. 11/926,613 (17 pages).

*Primary Examiner* — Steven Loke
*Assistant Examiner* — David Goodwin
(74) *Attorney, Agent, or Firm* — Wood, Herron & Evans, LLP

(57) ABSTRACT

A silicon-on-insulator (SOI) device and structure having locally strained regions in the silicon active layer formed by increasing the thickness of underlying regions of a buried insulating layer separating the silicon active layer from the substrate. The stress transferred from the underlying thickened regions of the insulating layer to the overlying strained regions increases carrier mobility in these confined regions of the active layer. Devices formed in and on the silicon active layer may benefit from the increased carrier mobility in the spaced-apart strained regions.

14 Claims, 3 Drawing Sheets

U.S. PATENT DOCUMENTS

| | | | |
|---|---|---|---|
| 2004/0195623 A1* | 10/2004 | Ge et al. | 257/347 |
| 2004/0217391 A1* | 11/2004 | Forbes | 257/288 |
| 2004/0232490 A1* | 11/2004 | Akatsuka et al. | 257/347 |
| 2005/0023616 A1* | 2/2005 | Forbes | 257/368 |
| 2005/0045995 A1* | 3/2005 | Ieong et al. | 257/627 |
| 2005/0087842 A1* | 4/2005 | Forbes | 257/617 |
| 2005/0158921 A1* | 7/2005 | Akatsuka et al. | 438/149 |
| 2005/0205936 A1* | 9/2005 | Grant et al. | 257/347 |
| 2006/0060856 A1* | 3/2006 | Anderson et al. | 257/66 |

FOREIGN PATENT DOCUMENTS

| | | |
|---|---|---|
| JP | 2001144276 A | 5/2001 |
| JP | 2002009145 A | 1/2002 |
| JP | 2003037272 A | 2/2003 |
| JP | 2003174161 A | 6/2003 |
| JP | 2004047806 A | 2/2004 |
| JP | 2004140274 A | 5/2004 |
| JP | 2005101234 A | 4/2005 |
| WO | 02/080276 A1 | 10/2002 |

* cited by examiner

METHOD FOR FABRICATING STRAINED SILICON-ON-INSULATOR STRUCTURES AND STRAINED SILICON-ON INSULATOR STRUCTURES FORMED THEREBY

FIELD OF THE INVENTION

The invention relates generally to semiconductor structures and devices and to a method for their fabrication and, more particularly, to fabrication methods and silicon-on-insulator (SOI) structures, devices and integrated circuits characterized by enhanced carrier mobility.

BACKGROUND OF THE INVENTION

Silicon-on-insulator (SOI) structures are constituted by a thin active silicon layer overlying a silicon dioxide insulating layer (i.e., the buried oxide, or "BOX"), which itself overlies a supporting silicon substrate. The advantages of SOI structures for metal-oxide-semiconductor field effect transistor (MOSFET) technology and complimentary metal-oxide-semiconductor (CMOS) integrated circuits are well documented. The insulating layer of the SOI structure enables field effect transistors (FET's) to operate at significantly higher speeds with improved electrical isolation and reduced electrical losses as compared with conventional bulk silicon technologies. The result is an increase in performance and a reduction in power consumption.

In conventional MOSFET and CMOS technologies, field effect transistors fabricated on an SOI structure include a channel formed in the active silicon layer. Carrier mobility is an important parameter because of its direct influence on output current and switching performance of the field effect transistors. Accordingly, one approach for increasing device performance is to enhance the channel mobility by straining the active silicon layer either biaxially or uniaxially. A net strain may be provided by introducing compressive stress into the silicon active layer or by introducing tensile stress into the silicon active layer. Straining the crystal lattice in the plane of the silicon layer either locally or globally alters the electronic band structure of the silicon layer. As a result, in-plane carrier mobility may be increased by ten to twenty-five percent, which results in improved device performance.

Biaxial tensile strain may also be induced in a silicon layer uniformly across an entire substrate by introducing an intervening layer formed of a material having a lattice constant greater than that of silicon. For example, a biaxially strained active silicon layer may be produced in an SOI structure by introducing a thin composite layer of graded silicon germanium buffer layer and a relaxed silicon germanium layer between the buried oxide layer and the silicon active layer, which is deposited epitaxially on the relaxed silicon germanium layer. The tensile strain increases the interatomic spacing of the silicon in the plane of the substrate, which increases electron mobility. A layer transfer approach may remove the silicon germanium layer. The existence of the uniform tensile stress enhances electron mobility in device channels of n-channel field effect transistors (NFET's) and hole mobility in p-channel field effect transistors (PFET's) for tensile stress introduced perpendicular to the direction of carrier flow in the PFET device channel.

Uniaxial compressive strain may be induced locally in a silicon layer by process optimizations. Small amounts of stress may be introduced by manipulating the properties of existing devices structures, such as capping layers, spacers, and shallow trench isolation. Greater amounts of stress may be introduced by, for example, depositing a graded silicon germanium layer only in the source and drain regions of PFET's. The local introduction of the silicon germanium layer has the effect of adding compressive strain to the PFET channel, which locally increases hole mobility.

The use of silicon germanium layers for forming strained silicon has certain disadvantages. Silicon germanium layers tend to introduce defects in the silicon that impact device yields. Global silicon germanium layers deposited across the wafer are not suitable for separately optimizing NFET's and PFET's. Silicon germanium layers also have poor thermal conductivity and some dopants diffuse more rapidly through the silicon germanium layer, which may influence diffusion doping profiles in source and drain regions formed in the active layer. Another practical limitation is that the silicon germanium layer contributes to increasing the overall thickness of the active layer, which is being scaled downwardly in modern device designs.

What is needed, therefore, is a method of introducing tensile strain into the active layer of an SOI structure without the use of an underlying, relaxed silicon germanium layer and SOI structures, devices and integrated circuits having a strained active layer fabricated by the method.

SUMMARY OF THE INVENTION

In accordance with the principles of the invention, SOI structures, devices and integrated circuits having a strained active layer are formed by introducing tensile strain into the active layer of the silicon-on-insulator substrate. The tensile strain is provided without introducing an underlying silicon germanium layer. To that end, such semiconductor structures generally include an active layer of a semiconductor material, a substrate, and an insulating layer disposed between the active layer and the substrate. The insulating layer has a thickened region transferring tensile stress to the active layer effective to induce strain in a strained region of the active layer overlying the thickened region.

In accordance with the principles of the invention, locally increasing the thickness of the buried insulating layer transfers tensile stress locally to the overlying active layer. Regions of the active layer, which are defined by an oxidation mask, are strained by the tensile stress. The strained active layer is characterized by an enhanced carrier mobility, thereby improving the device performance of devices formed in and on the strained active layer. The strain may be introduced into the active layer without reliance on complex film deposition techniques as the underlying insulating layer is altered without adding any additional layers to the device structure. In particular, silicon active layers may be strained while avoiding the disadvantages of silicon germanium layers.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
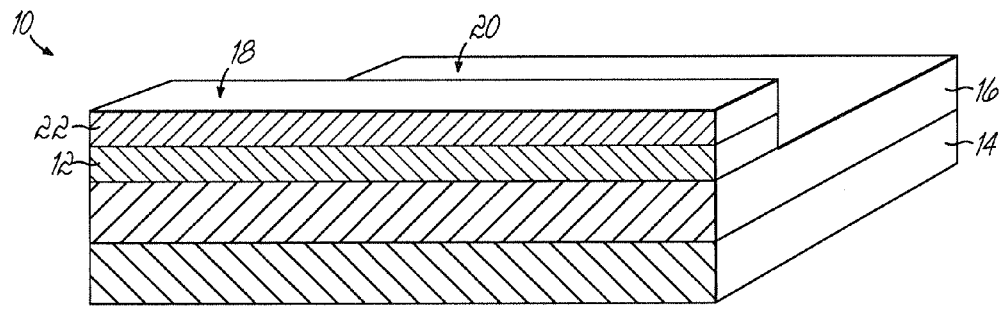
FIG. 1 is a diagrammatic perspective view in partial cross-section of a portion of a substrate.

With reference to FIG. 1, a silicon-on-insulator (SOI) substrate 10 includes an active layer 12 of silicon, or another suitable semiconductor material, separated vertically from a handle wafer 14 by an insulating layer 16. Insulating layer 16 electrically isolates the active layer 12 from the handle wafer 14. The SOI substrate 10 may be fabricated by any standard technique, such as wafer bonding or a separation by implantation of oxygen (SIMOX) technique. In the illustrated embodiment of the invention, the silicon constituting the active layer 12 may be doped initially with an n-type dopant to render it n-type or a p-type dopant to render it p-type. The handle wafer 14 may be formed from any suitable semiconductor material including, but not limited to, silicon and polycrystalline silicon (polysilicon). The dielectric material constituting insulating layer 16 is typically silicon dioxide having a thickness in the range of about fifty (50) nanometers to about 150 nanometers, but is not so limited. The active layer 12 may be as thin as about ten (10) nanometers or less and, typically, is in the range of about twenty (20) nanometers to about 150 nanometers. The thickness of the handle wafer 14 is not shown to scale in FIG. 1.

Active layer 12 is typically capped with a capping layer 22 of a hard mask material, such as a pad nitride, in order to provide a self-aligned upper oxidation barrier and polish stop. To that end, a conformal blanket of the hard mask material, which may be 10 to 150 nanometers of silicon nitride ($Si_3N_4$), is applied over the active layer 12. A radiation-sensitive resist layer is applied over the conformal blanket layer, exposed with radiation projected through a conventional photomask to impart a latent projected image pattern in the resist layer characteristic of the intended islands 18, and developed to transform the latent image pattern into a final image pattern. An etch process, such as an anisotropic etching process (e.g. reactive ion etching), removes hard mask material of capping layer 22 in unmasked areas of the final image pattern. The resist layer is stripped from the SOI substrate 10 following the completion of the etch process.

The line width of each island 18 is selected in accordance with conventional design techniques and, in certain embodiments, is in the range of about 15 nm to about 125 nm. Insulating layer 16 and the trenches 20 between adjacent islands 18 furnish lateral electrical isolation.

References herein to terms such as "vertical", "horizontal", etc. are made by way of example, and not by way of limitation, to establish a frame of reference. The term "horizontal" as used herein is defined as a plane parallel to the conventional plane or surface of SOI substrate 10, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood various other frames of reference may be employed without departing from the spirit and scope of the invention.

Figure 2:
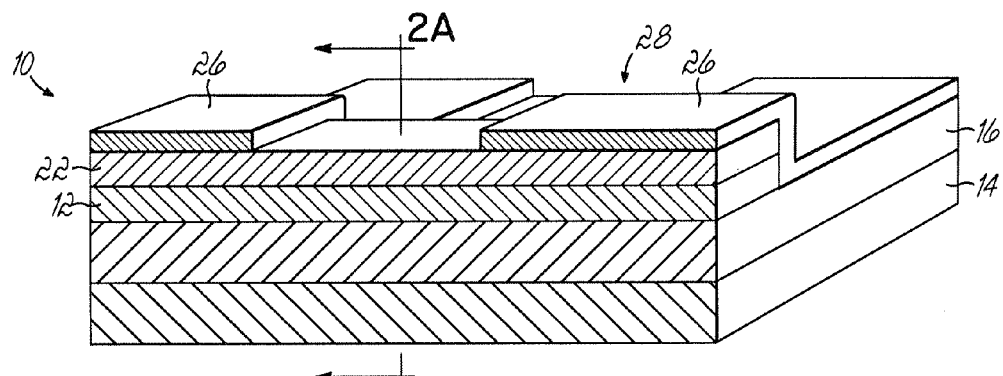
FIG. 2 is a view similar to FIG. 1 at a subsequent fabrication stage.
Figure 2A:
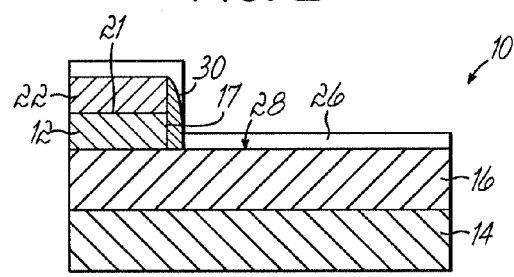
FIG. 2A is a cross-sectional view taken generally along lines 2A-2A of FIG. 2.

With reference to FIGS. 2 and 2A in which like reference numerals refer to like features in FIG. 1 and at a subsequent fabrication stage, stripes 26 of an oxidation-masking material are fabricated in order to define windows 28 through which oxidation will occur. Each of windows 28, of which one window 28 is shown, separates adjacent stripes 26. To fabricate stripes 26, a blanket layer of oxidation-masking material is deposited over the structure of FIG. 1 and patterned by a standard lithography and etch process. Stripes 26 overlie and cover the upper surface of the capping layer 22 and the insulating layer 16 in regions that, in conjunction with islands 18, bound or flank windows 28. The directional etch process creating the windows 28 leaves a spacer 30 of oxidation masking material covering each of the vertical sidewalls 17, 19 of the active layer 12, which sidewalls 17, 19 extend to the insulating layer 16 and of which vertical sidewall 19 is visible in FIGS. 6A, 6B. The directional etch process creating windows 28 also should stop on the thin etch stop material underlying the oxidation-masking material so as to not erode capping layer 22.

Figure 3:
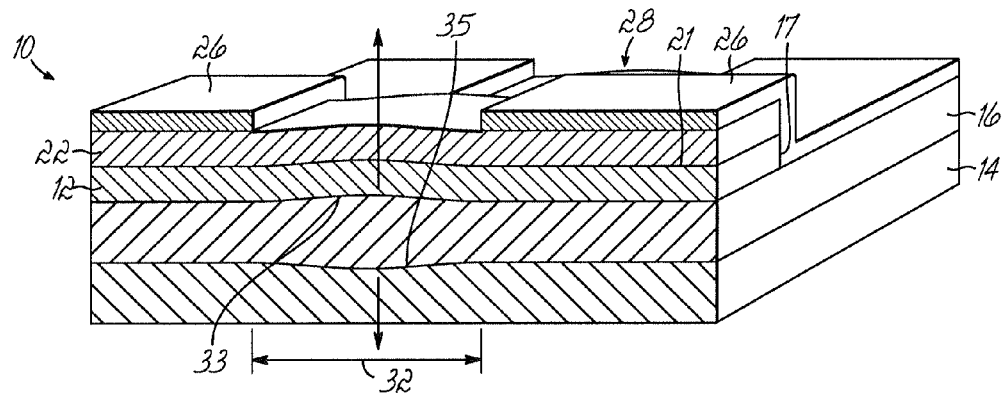
FIG. 3 is a view similar to FIG. 2 at a subsequent fabrication stage.

With reference to FIG. 3 in which like reference numerals refer to like features in FIG. 2 and at a subsequent fabrication stage, the insulating layer 16 is effectively thickened by a suitable process over an area in the horizontal plane of SOI substrate 10 and beneath localized regions 32 of active layer 12. The thickened regions of the insulating layer 16 generally coincide vertically with the regions of active layer 12. The thickening of insulating layer 16 may originate from a process that incrementally consumes material from a planar lower surface 33 of active layer 12 and/or a planar upper surface 35 of handle wafer 14 coextensive with the insulating layer 16 to form material having a new composition of increased volume, or by any other mechanism capable of expanding or increasing the effective thickness of insulating layer 16. Regions 32 are, in general, in-plane areas of active layer 12 aligned horizontally in the plane of SOI substrate 10 with windows 28.

The extent of the thickness increase of insulating layer 16 may vary depending upon the required performance of the semiconductor device to be formed in the active layer 12 and upon any design or physical limit on the expansion. In certain embodiments of the invention, the distance separating adjacent stripes 26 is on the order of about one (1) μm.

In an exemplary embodiment of the invention, a thermal oxidation process is used to locally thicken the insulating layer 16 of the SOI substrate 12 in which mask 24 is formed of a non-oxidizable material, such as silicon nitride, that operates as an oxidation mask. The oxidation process entails exposing the SOI substrate 10 to a dry or wet oxygen-laden, heated ambient in, for example, an oxidation furnace or a rapid thermal anneal chamber. Oxidation conditions are selected to provide the selective expansion of insulating layer 16 only in regions underlying regions 32 of the active layer 12 and to avoid uniformly thickening insulating layer 16 across the SOI substrate 12. In one specific embodiment, a wet oxidation at 800° C. to 950° C. is performed for a duration sufficient to increase the thickness of the insulating layer by 1 nanometer to 10 nanometers over a region underlying region 32. In another embodiment, the thickness of the thickened region is increased by an increment in the range of about 5 nanometers to about 10 nanometers. In other embodiments of the invention in which the distance separating adjacent stripes 26 is about 0.2 μm, an oxide thickness increase underlying region 32 of about 4.5 nanometers provides about 0.1 percent strain in region 32. The thickness increase of the insulating layer 16 is determined by a maximum increase in thickness over the thickened region as the thickness increase is nonuniform even beneath region 32, although the invention is not so limited.

Oxidation of active layer 12 occurs by transport of the gaseous oxidizing species from the bulk of the oxidizing gas in the heated ambient through the windows 28 due to absorption by the material forming insulating layer 16. The capping layer 22 and stripes 26 of mask 24 overlying the island 18 and the spacer 30 covering the vertical sidewalls 17, 19 of the island 18 shield the active layer 12 against direct inward transport of the gaseous oxidizing species, typically either $O_2$ or $H_2O$, from the oxygen-laden environment so that the sidewalls 17, 19 and upper surface 21 of active layer 12 are substantially unaffected by the oxidation process.

With continued reference to FIG. 3 and in accordance with the exemplary embodiment, the gaseous oxidizing species diffuses from each window 28 through the insulating layer 16 to react chemically with the silicon in the lower surface 33 of active layer 12. Potentially, the diffusing species may react with the material in the upper surface 35 of the handle wafer 14 if the material constituting handle wafer 14 is susceptible to oxidation. The diffusion path for oxidizing species to the lower surface 33 of active layer 12 is shorter for portions of active layer 12 in regions 32 than in areas outside of regions 32 that underlying the stripes 26 of mask 24. In addition and if applicable, the diffusion path for oxidizing species to the upper surface 35 of handle wafer 14 is shorter for areas of handle wafer 14 in regions 32 than in areas of handle wafer 14 outside of regions 32 and underlying the stripes 26 of mask 24. Hence, the effective thickness increase of the insulating layer 16, which may have the same composition as the oxidized portions of active layer 12 and, potentially, the same composition as the oxidized portions of handle wafer 14, is greater underlying regions 32. As known, the thickness of the formed silicon dioxide is equal to about 2.27 times the thickness of the consumed silicon. The localized expansion of the insulating layer 16 raises regions 32 of active layer 12 overlying the thickened regions of the insulating layer 16 vertically relative to the adjacent regions covered by the stripes 26 of mask 24.

The expansion of insulating layer 16 stresses the material of active layer 12 in regions 32 of each island 18, which induces a net amount of strain into the regions 32. This net amount of localized strain, which is typically in the range of one-tenth to two-tenths of a percent, modifies the electrical properties of carriers in the strained regions 32 of the active layer 12. If the active layer 12 is silicon, the strain increases carrier mobility in regions 32 by as much as twenty percent or greater. Hence, the device performance of devices subsequently fabricated in each island 18 will be improved if, for example, device channels are situated in the strained regions 32. The amount of oxidation may be regulated to influence the degree of strain introduced into the strained regions 32. In addition, the width of windows 28 will also have an effect on the strain induced in regions 32.

Figure 4:
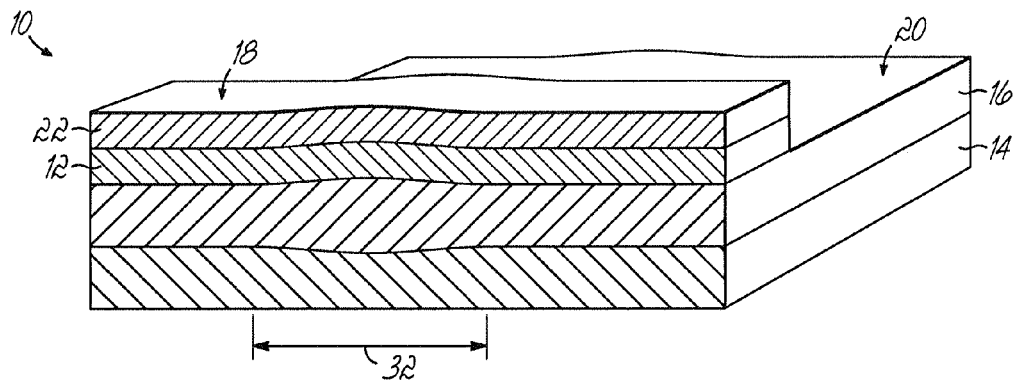
FIG. 4 is a view similar to FIG. 3 at a subsequent fabrication stage.

With reference to FIG. 4 in which like reference numerals refer to like features in FIG. 3 and at a subsequent fabrication stage, the mask 24 (FIG. 3) is stripped from the SOI substrate 10 by an etch process selective to the material of the active layer 12 and the insulating layer 16. If the mask 24 and the capping layer 22 are formed from the same material, the thickness of the capping layer 22 must be greater than the thickness of the mask 24 so that capping layer 22 is not completely removed between stripes 26. The regions of the islands 18 formerly underlying the mask 24 are substantially anchored by the attachment of the flanking regions of active layer 12 to insulating layer 16 so that relaxation of strained regions 32 is prevented or limited. As a result, the strained regions 32 are permanently stressed by the increased thickness or expansion of the insulating layer 16 in the appropriate locations underlying regions 32. If some relaxation is expected, the initial strain in regions 32 may be increased to compensate for the relaxation.

Figure 5:
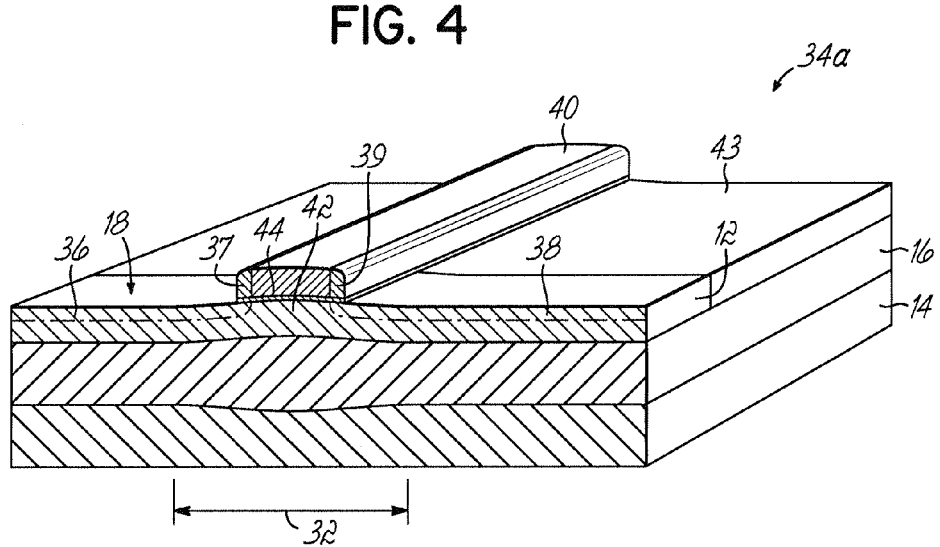
FIG. 5 is a view similar to FIG. 4 following a series of subsequent fabrication stages.
Figure 6A:
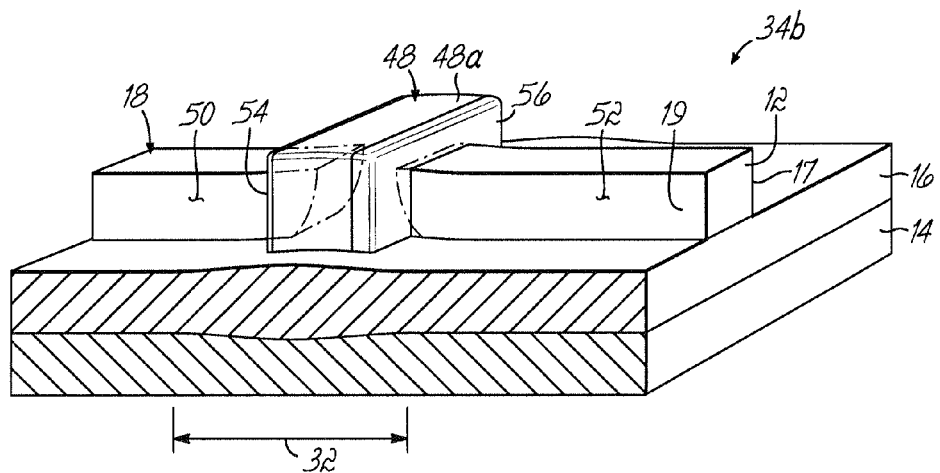
FIG. 6A is a view similar to FIG. 5 following a series of subsequent fabrication stages in accordance with an alternative embodiment of the invention.
Figure 6B:
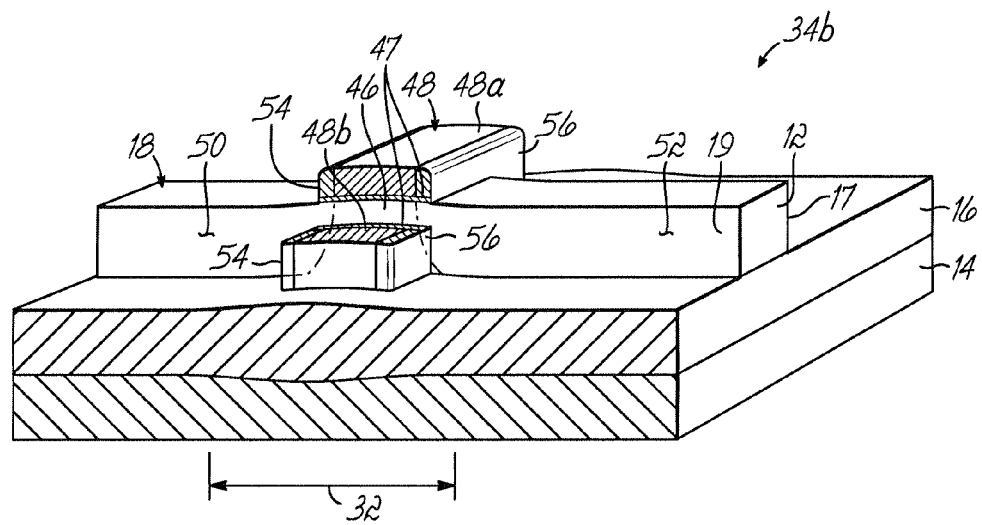
FIG. 6B is a view similar to FIG. 6A.

With reference to FIGS. 5, 6A and 6B in which like reference numerals refer to like features in FIG. 4 and at a subsequent fabrication stage, semiconductor devices are formed in and on the islands 18 having channel regions within the strained regions 32, which improves carrier mobility in the devices so that the devices exhibit increased performance. The MOSFET devices illustrated herein are not intended to be limiting as one skilled in the art will appreciate that other types of semiconductor devices (e.g., memory cells, other types of transistors and the like) can also benefit from the strained regions described herein.

With particular reference to FIG. 5, one type of semiconductor devices 34a may be metal-oxide-semiconductor field effect transistors (MOSFET's) each having source/drain regions 36, 38 and an electrostatically-coupled gate electrode 40 located above a channel 42 defined in the active layer 12 between the source/drain regions 36, 38. A thin gate dielectric 44 insulates the gate electrode 42 electrically from the channel 42. The material used to form the gate electrode 42 may be, for example, polysilicon, tungsten, or any other desired material and the source/drain regions 36, 38 and their extensions may be supplied by ion implantation of suitable dopant species. Sidewall spacers 37, 39 of a material such as silicon nitride may be added to the vertical sidewalls of the gate electrode 42 as is well known in the art. The spacers 37, 39 and the gate electrode 42 collectively serve as a self-aligned mask for implantation of the deep doped portions of the source/drain regions 36, 38. Isolation regions 43 provide electrical isolation between adjacent islands 18 of active layer 12. The isolation regions 43 are filled with an appropriate dielectric material, such as silicon dioxide deposited conformally by chemical vapor deposition (CVD), that is polished flat and planarized by a chemical-mechanical polishing (CMP) process or any other suitable planarization technique. The capping layer 22 acts as a polish stop for the planarization operation and is removed after the planarization operation.

Carriers flow between the source/drain regions 36, 38 through the channel 42 in proportion to the variation in electrical resistivity in the channel 42, which varies in proportion to voltage applied to the gate electrode 40. The devices 34a are fabricated such that each channel 42 coincides with one of the strained regions 32. In certain embodiments of the invention, the devices 3a4 are n-channel field effect transistors (NFET's) and any p-channel field effect transistors (PFET's) present in the integrated circuit are formed in areas of the SOI substrate 10 lacking the strained regions 32. The field effect transistors are formed by a conventional fabrication process familiar to persons of ordinary skill in the art.

With particular reference to FIGS. 6A and 6B, another type of semiconductor devices 34b may be self-aligned double gate fin field effect transistors (finFET) each having a thin vertical layer (fin) furnishing a channel 46 and a gate electrode 48 defining two individual gate portions 48a, 48b (FIG. 5C) that flank the channel region 46. The gate electrode 48 is positioned between source/drain regions 50, 52 and overlies the channel 46. Gate electrode 48 is electrically isolated from gate electrode 48 by a gate dielectric 47. Spacers 54, 56 are provided that flank the gate electrode 48. The device 34b is fabricated such that the channel 46 coincides with the strained region 32. The invention contemplates that all or a portion of capping layer 22 may remain on the active layer 12 in the completed device structure. The finFET is formed by a conventional fabrication process familiar to persons of ordinary skill in the art.

Figure 7:
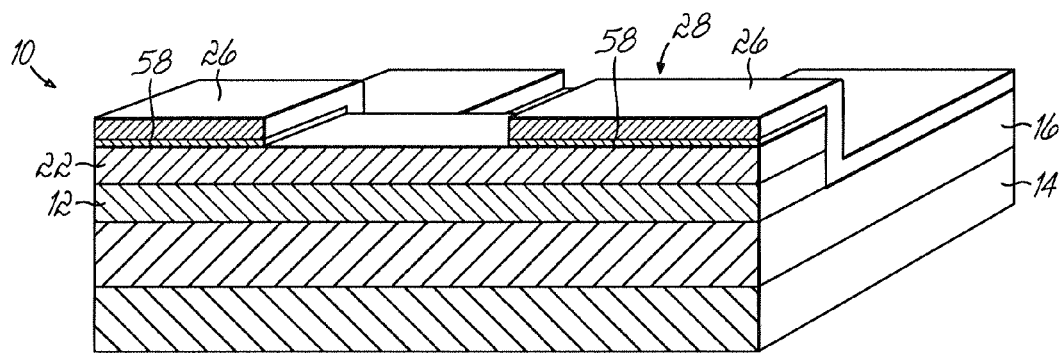
FIG. 7 is a view similar to FIG. 2 in accordance with an alternative embodiment of the invention.

With reference to FIG. 7 in which like reference numerals refer to like features in FIG. 2, a pad layer 58 may be applied to the capping layer 22 before the mask 24 is applied and patterned. The pad layer 58 is any material that operates as an etch stop during the etch that patterns mask 24 and the etch that removes mask 24. The pad layer 58 effectively prevents these individual etch processes from thinning the capping layer 22 between stripes 26. One suitable material for pad layer 58 is silicon dioxide, if the capping layer 22 is silicon nitride, approximately 2 nanometers to approximately 10 nanometers in thickness. Excessive thinning of capping layer 22 will reduce its effectiveness as a polish stop and oxidation mask.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor structure comprising:
   an island of a semiconductor material, said island including a plurality of sidewalls and a strained region;
   a handle wafer; and
   an insulating layer disposed between said island and said handle wafer, said insulating layer containing a thickened region underlying said strained region, said insulating layer electrically isolating said island of said semiconductor material from said handle wafer, and said thickened region transferring tensile stress to said strained region.
   wherein a thickness of said thickened region is increased by an increment in the range of about 5 nanometers to about 10 nanometers.

2. The semiconductor structure of claim 1 wherein said insulating layer is a buried oxide layer and said island is silicon.

3. The semiconductor structure of claim 1 further comprising:
   a source defined in said island;
   a drain defined in said island; and
   a channel defined in a portion of said island between said source and said drain, said channel disposed at least partially in said strained region of said island.

4. The semiconductor structure of claim 3 further comprising:
   a gate electrode electrically isolated from said portion of said island defining said channel.

5. The semiconductor structure of claim 4 wherein said strained region divides said gate electrode.

6. The semiconductor structure of claim 4 wherein said gate electrode generally overlies said channel.

7. The semiconductor structure of claim 1 further comprising:
   a semiconductor device fabricated using said island.

8. The semiconductor structure of claim 1 wherein said island is silicon and said thickened region of said insulating layer is formed by oxidation of said island.

9. The semiconductor structure of claim 8 wherein said insulating layer is silicon dioxide.

10. The semiconductor structure of claim 8 wherein said handle wafer is silicon and said thickened region is formed by oxidation of said handle wafer.

11. The semiconductor structure of claim 1 wherein said tensile stress is effective to enhance carrier mobility within said strained region.

12. The semiconductor structure of claim 1 wherein said thickened region of said insulating layer has a thickness greater than that of surrounding regions of said insulating layer flanking said thickened region.

13. The semiconductor structure of claim 1 further comprising:
   first and second anchors flanking said strained region, said first and second anchors effective for limiting relaxation of said strained region of said island.

14. The semiconductor structure of claim 13 wherein said first and second anchors comprise adjacent regions of said island flanking said strained region.

* * * * *